United States Patent
Tsutsumi et al.

(10) Patent No.: US 8,222,655 B2
(45) Date of Patent: Jul. 17, 2012

(54) SEMICONDUCTOR LIGHT-EMITTING DEVICE AND PROCESS FOR PRODUCING THE SAME

(75) Inventors: Kazuaki Tsutsumi, Kyoto (JP); Norikazu Ito, Kyoto (JP); Masayuki Sonobe, Kyoto (JP); Shinichi Tamai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/223,739

(22) PCT Filed: Feb. 8, 2007

(86) PCT No.: PCT/JP2007/052220
§ 371 (c)(1),
(2), (4) Date: Oct. 15, 2008

(87) PCT Pub. No.: WO2007/091637
PCT Pub. Date: Aug. 16, 2007

(65) Prior Publication Data
US 2009/0272992 A1      Nov. 5, 2009

(30) Foreign Application Priority Data
Feb. 8, 2006   (JP) .................. 2006-030963

(51) Int. Cl.
*H01L 21/00* (2006.01)
(52) U.S. Cl. .......... 257/94; 257/101; 257/103; 257/197; 438/46; 438/47
(58) Field of Classification Search .......... None
See application file for complete search history.

(56) References Cited

U.S. PATENT DOCUMENTS

| 6,309,459 | B1 * | 10/2001 | Yuge .............................. 117/105 |
| 6,555,403 | B1 | 4/2003 | Domen et al. |
| 7,339,195 | B2 | 3/2008 | Goto et al. |
| 2002/0195606 | A1 * | 12/2002 | Edmond et al. ................. 257/79 |
| 2003/0006409 | A1 | 1/2003 | Ohba |

FOREIGN PATENT DOCUMENTS

| JP | 11-54794 | 2/1999 |
| JP | 11-340580 | 12/1999 |
| JP | 2001-326426 | 11/2001 |
| JP | 2002-261395 | 9/2002 |
| JP | 2003-23220 | 1/2003 |
| JP | 2003-81697 | 3/2003 |
| JP | 2005-150627 | 6/2005 |

* cited by examiner

*Primary Examiner* — Bradley K Smith
*Assistant Examiner* — Mohammad Choudhry
(74) *Attorney, Agent, or Firm* — Hamre, Schumann, Mueller & Larson, P.C.

(57) ABSTRACT

A semiconductor light emitting device of the present invention includes a substrate (1), an n-GaN layer (2) supported by the substrate (1), a p-GaN layer (7) which is located farther from the substrate (1) than the n-GaN layer (2) is, an active layer (4) formed between the n-GaN layer (2) and the p-GaN layer (7) and containing InGaN, a sublimation preventing layer (5) formed between the active layer (4) and the p-GaN layer (7) and containing InGaN, and an In composition gradient layer (6) sandwiched between the sublimation preventing layer (5) and the p-GaN layer (7) and having such In composition ratio gradient that the In composition ratio decreases in the thickness direction toward the p-GaN layer (7).

8 Claims, 3 Drawing Sheets

SEMICONDUCTOR LIGHT-EMITTING DEVICE AND PROCESS FOR PRODUCING THE SAME

TECHNICAL FIELD

The present invention relates to a semiconductor light emitting device that includes a semiconductor layer containing GaN, and also relates to a method for manufacturing such a semiconductor light emitting device.

BACKGROUND ART

FIG. 5 shows an example of conventional semiconductor light emitting device. The semiconductor light emitting device X shown in the figure includes an n-GaN layer 92 which is an n-type semiconductor layer formed on a substrate 91, a p-GaN layer 93 which is a p-type semiconductor layer, and an active layer 94 having a multiple quantum well (hereinafter referred to as "MQW") structure. The active layer 94 has a laminated structure made up of semiconductor layers containing InGaN with different In composition ratios. An n-side electrode 95 is formed on the lower surface (in FIG. 5) of the substrate 91, whereas a p-side electrode 96 is formed on an upper surface (in FIG. 5) of the p-GaN layer 93. The active layer 94 is sandwiched between lower clad layers 97a, 97b and upper clad layers 98a, 98b. The lower clad layer 97a and the upper clad layer 98a are semiconductor layers containing InGaN and having the same In composition ratio as that of the barrier layer of the active layer 94. Thus, the lower clad layers 97a, 97b and the upper clad layers 98a, 98b alleviate the lattice strain between the layers sandwiching the clad layers.

Each of the layers constituting the semiconductor light emitting device X is very thin, having a thickness of several tens of nanometers. Thus, it is difficult to control the In composition ratio in the manufacturing process. For instance, in forming the upper clad layer 98b after the upper clad layer 98a is formed, the In contained in the upper clad layer 98a may be lost by sublimation due to difference between these layers in formation temperature or formation gas, for example. In such a case, the In composition ratio in the upper clad layer 98a unduly reduces, whereby the alleviation of the lattice strain between the active layer 94 and the p-GaN layer 93 is hindered.

Patent Document 1: JP-A-2005-150627

DISCLOSURE OF THE INVENTION

Problems to be Solved by the Invention

The present invention is proposed under the circumstances described above. It is, therefore, an object of the present invention to provide a semiconductor light emitting device which is capable of alleviating lattice strain between semiconductor layers and a method for manufacturing such a semiconductor light emitting device.

Means for Solving the Problems

According to a first aspect of the present invention, there is provided a semiconductor light emitting device comprising a substrate, a first nitride semiconductor layer supported by the substrate, a second nitride semiconductor layer which is located farther from the substrate than the first nitride semiconductor layer is, an active layer formed between the first and the second nitride semiconductor layers and containing InGaN, a sublimation preventing layer formed between the active layer and the second nitride semiconductor layer and containing InGaN, and an In composition gradient layer sandwiched between the sublimation preventing layer and the second nitride semiconductor layer and having such In composition ratio gradient that the In composition ratio decreases in a thickness direction toward the second nitride semiconductor layer.

In a preferred embodiment of the present invention, the In composition ratio in the sublimation preventing layer is 0 to 1%.

In a preferred embodiment of the present invention, the sublimation preventing layer has a thickness of 3 to 20 nm.

In a preferred embodiment of the present invention, the In composition ratio gradient of the In composition gradient layer is so set that the In composition ratio decreases from 5% to 0% in the thickness direction from the sublimation preventing layer side toward the second nitride semiconductor layer side.

According to a second aspect of the present invention, there is provided a method for manufacturing a semiconductor light emitting device provided according to the first aspect of the present invention. The method comprises the step of forming the In composition gradient layer while monotonically increasing film formation temperature with time. The In composition gradient layer formation step is performed after the sublimation preventing layer is formed and before the second nitride semiconductor layer is formed.

BEST MODE FOR CARRYING OUT THE INVENTION

Preferred embodiments of the present invention will be described below with reference to the accompanying drawings.

Figure 1:
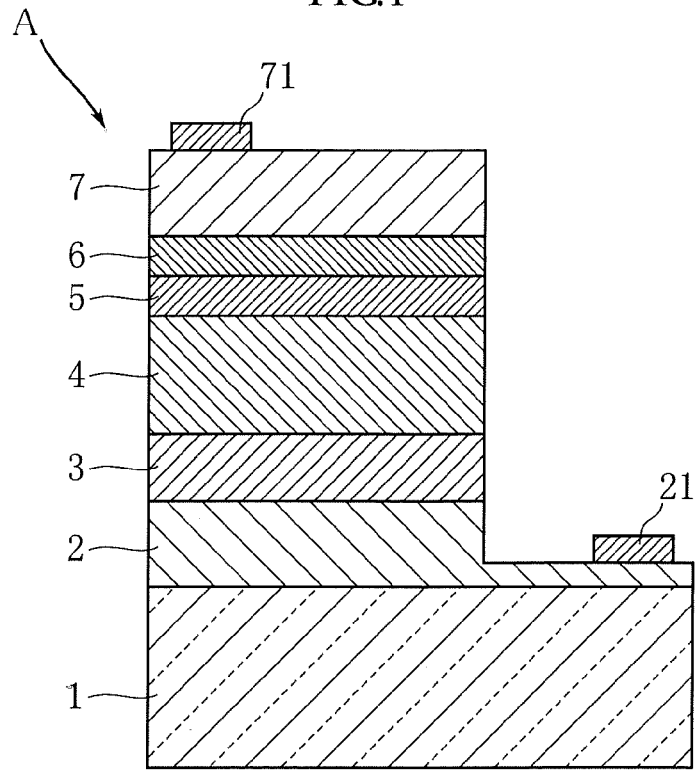
FIG. 1 is a sectional view showing an example of semiconductor light emitting device according to the present invention.

FIG. 1 shows an example of semiconductor light emitting device according to the present invention. The semiconductor light emitting device A of this embodiment includes a substrate 1, an n-GaN layer 2, a superlattice layer 3, an active layer 4, a sublimation preventing layer 5, an In composition gradient layer 6, and a p-GaN layer 7. The semiconductor light emitting device A is designed to emit blue light or green light.

The substrate 1 may be made of e.g. sapphire and supports the n-GaN layer 2, the superlattice layer 3, the active layer 4, the sublimation preventing layer 5, the In composition gradient layer 6, and the p-GaN layer 7. In this embodiment, the substrate 1 has a thickness of about 300 to 500 μm, for example.

The n-GaN layer 2 is an n-type semiconductor layer formed by doping Si into GaN and an example of first nitride semiconductor layer of the present invention. The concept of the first nitride semiconductor layer of the present invention includes not only a layer directly formed on the substrate 1 like the n-GaN layer 2 but also a layer indirectly supported by the substrate 1 via a buffer layer made of e.g. AlN, GaN or AlGaN for alleviating lattice strain. In this embodiment, the n-GaN layer 2 has a thickness of about 3 to 6 μm. The n-GaN layer 2 is formed with an n-side electrode 21.

The superlattice layer 3 has a superlattice structure in which InGaN layers and GaN layers are so laminated that the single atomic layers are alternately arranged. In the superlattice layer 3 of this embodiment, five to twenty InGaN layers having an In composition ratio of about 5 to 10% and five to twenty GaN layers are laminated. The thickness of the superlattice layer 3 is about 30 to 60 nm.

The active layer 4 has an MQW structure containing InGaN and serves to amplify the light emitted by the recombination of electrons and holes. The active layer 4 is made up of a plurality of InGaN layers and a plurality of GaN layers which are alternately laminated. The In composition ratio in the InGaN layers is about 15%, so that the band gap of the InGaN layers is smaller than those of the n-GaN layer 2 and the superlattice layer 3. Thus, the InGaN layers constitute well layers of the active layer 4. The GaN layers constitute the barrier layers of the active layer 4. In the active layer 4 of this embodiment, three to seven InGaN layers and three to seven GaN layers are laminated. The thickness of the active layer 4 is about 50 to 150 nm.

The sublimation preventing layer 5 contains InGaN and prevents the sublimation of In from the active layer 4 in the process of manufacturing the semiconductor light emitting device A. In this embodiment, the sublimation preventing layer 5 has an In composition ratio of about 0 to 1% and a thickness of about 3 to 20 nm.

The In composition gradient layer 6 contains InGaN. The In composition gradient layer 6 has different In composition ratios at different positions in the thickness direction. Specifically, in the In composition gradient layer, the In composition ratio reduces from the sublimation preventing layer 5 side toward the p-GaN layer 7 side. Preferably, the In composition ratio in the In composition gradient layer 6 is about 0 to 5%. The thickness of the In composition gradient layer 6 is about 3 to 16 nm.

The p-GaN layer 7 is a p-type semiconductor layer formed by doping Mg into GaN and an example of second nitride semiconductor layer of the present invention. In this embodiment, the p-GaN layer 7 has a thickness of about 100 to 1500 nm. The p-GaN layer 7 is formed with a p-side electrode 71.

Example 1

Figure 2:
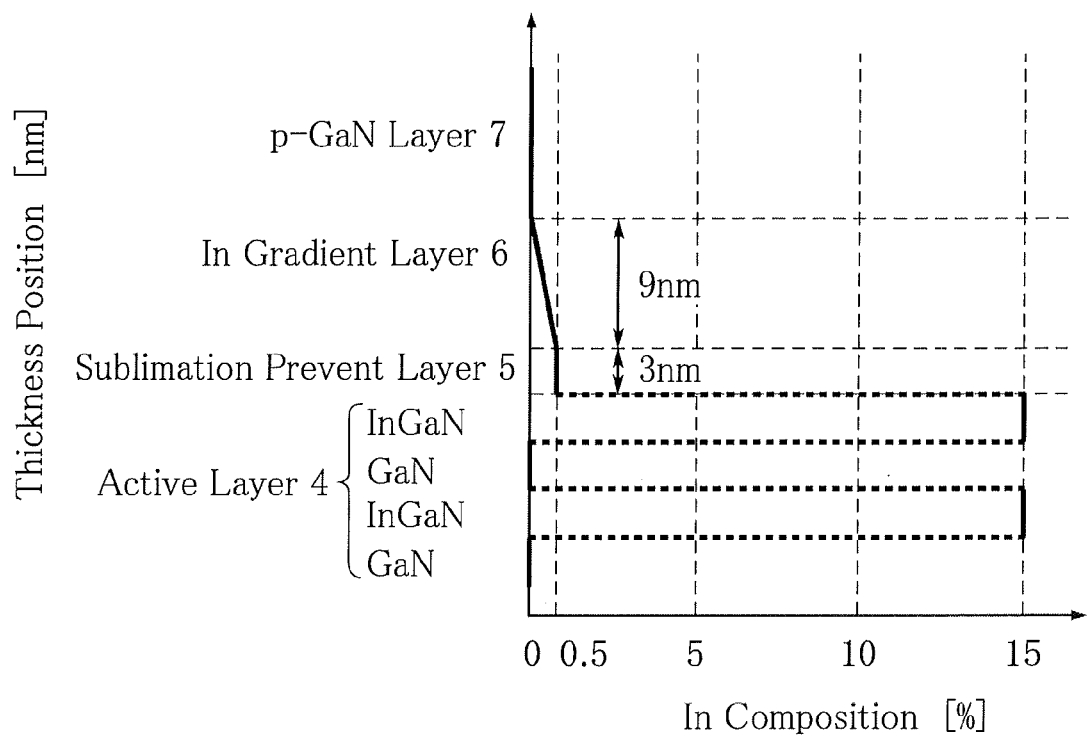
FIG. 2 is a graph showing the In composition ratio in the thickness direction in Example 1.
Figure 3:
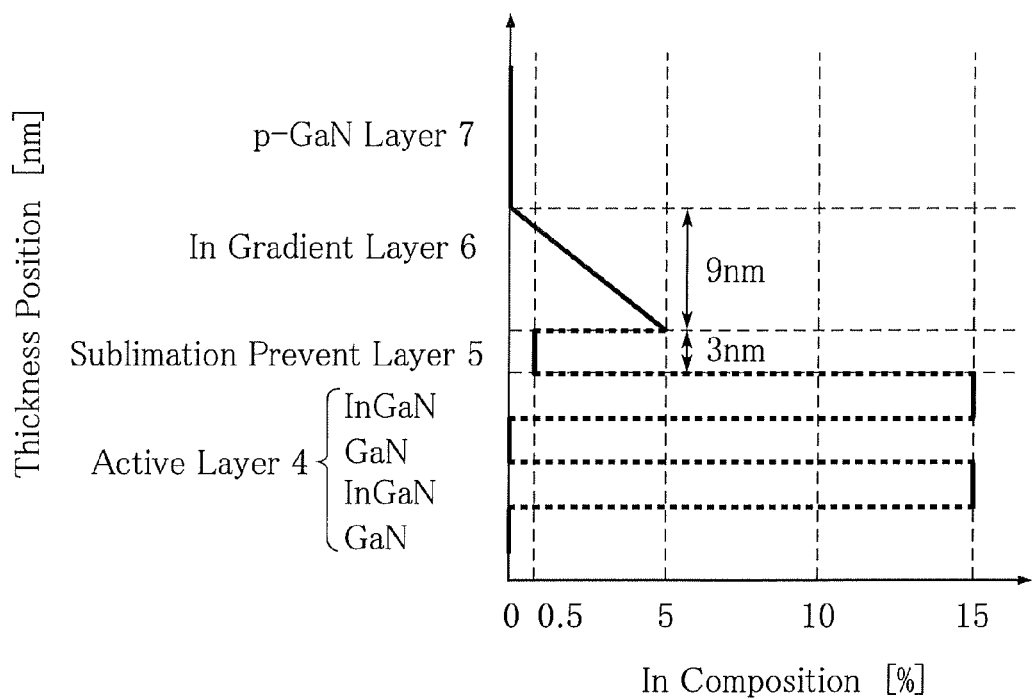
FIG. 3 is a graph showing the In composition ratio in the thickness direction in Example 2.

FIG. 2 shows the In composition ratio in the sublimation preventing layer 5 and the In composition gradient layer 6 in Example 1 of the foregoing embodiment. As shown in the figure, the sublimation preventing layer 5 of this Example has an In composition ratio of 0.5% and a thickness of 3 nm. On the other hand, the In composition ratio in the In composition gradient layer 6 is 0.5% at the end adjoining the sublimation preventing layer 5 and 0% at the end adjoining the p-GaN layer 7. The In composition ratio in the In composition gradient layer 6 linearly decreases monotonically in the thickness direction from the sublimation preventing layer 5 side toward the p-GaN layer 7 side. The thickness of the In composition gradient layer 6 is 9 nm.

Example 2

FIG. 2 shows In composition ratio in the sublimation preventing layer 5 and the In composition gradient layer 6 in Example 2 of the foregoing embodiment. As shown in the figure, the sublimation preventing layer 5 of this Example is the same as that of Example 1. In this Example, however, the In composition ratio in the In composition gradient layer 6 is 5% at the end adjoining the sublimation preventing layer 5 and 0% at the end adjoining the p-GaN layer 7. Thus, unlike Example 1, the In composition ratio in this Example is discontinuous at the boundary between the sublimation preventing layer 5 and the In composition gradient layer 6.

Figure 4:
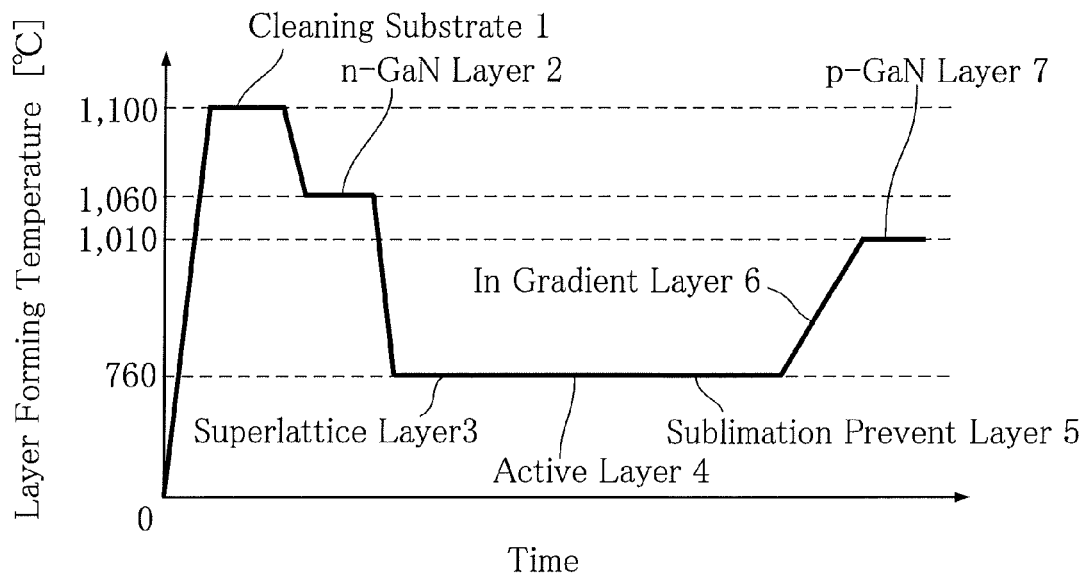
FIG. 4 shows the change of film formation temperature in a manufacturing method of Example 1.
Figure 5:
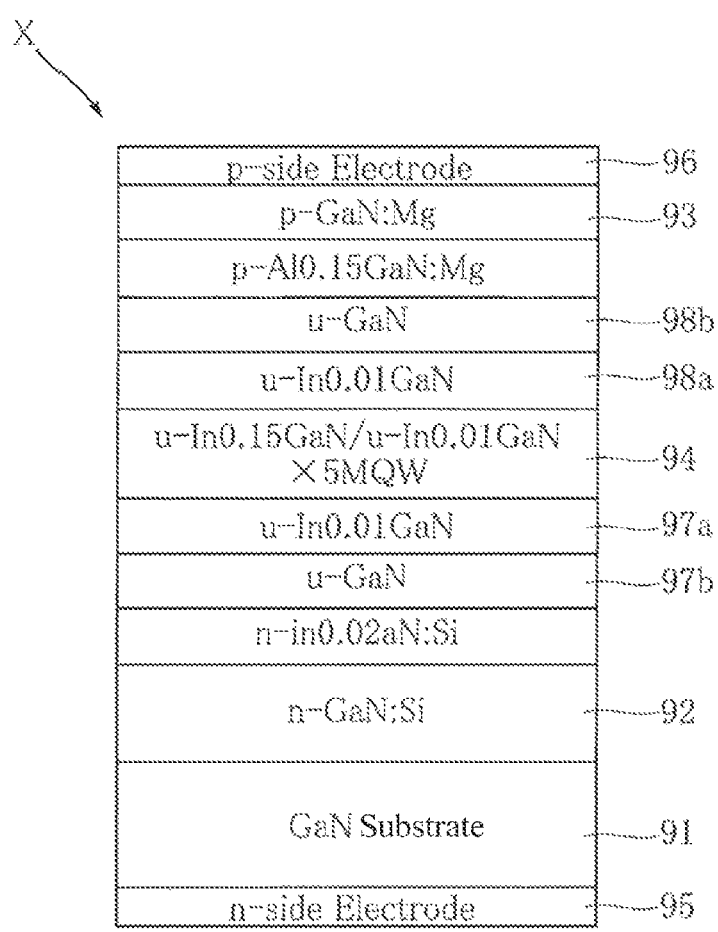
FIG. 5 is a sectional view showing an example of conventional semiconductor light emitting device.

A method for manufacturing the semiconductor light emitting device A, particularly a method for manufacturing the semiconductor light emitting device of Example 1 will be exemplarily described below. FIG. 4 shows the change of film formation temperature in a method for manufacturing a semiconductor light emitting device of Example 1.

First, a substrate 1 is placed in a film formation chamber for MOCVD, and the film formation temperature, i.e., the temperature in the film formation chamber is set to 1,100° C. In this state, $H_2$ gas and $N_2$ gas are supplied into the film formation chamber to clean the substrate 1.

Then, with the film formation temperature lowered to 1,060° C., $NH_3$ gas, $H_2$ gas, $N_2$ gas and trimethylgallium (hereinafter referred to as "TMG") gas are supplied into the film formation chamber. At the same time, $SiH_4$ gas is supplied to perform doping of Si which is an n-type dopant. As a result, n-GaN layer 2 is formed on the substrate 1.

Then, with the film formation temperature lowered to the range of 700 to 800° C., e.g. about 760° C., $NH_3$ gas, $H_2$ gas, $N_2$ gas, triethylgallium (hereinafter referred to as "TEG") gas and trimethylindium (hereinafter referred to as "TMIn") gas are supplied into the film formation chamber. As a result, an InGaN layer having an In composition ratio of about 5 to 10% is formed. After the formation of the InGAN layer, $NH_3$ gas, $H_2$ gas, $N_2$ gas and TMG gas are supplied into the film formation chamber, whereby a GaN layer is formed. By repeating the formation of an InGaN layer and the formation of a GaN layer about five to twenty times, a superlattice layer 3 having a thickness of about 30 to 60 nm is formed.

Then, with the film formation temperature maintained, $NH_3$ gas, $H_2$ gas, $N_2$ gas, TEG gas and TMIn gas are supplied into the film formation chamber. It is to be noted that the proportion of the TMIn gas is adjusted depending on the In composition ratio in the InGaN layer to be formed. By this process, an InGaN layer as a well layer having an In composition ratio of about 15% is formed.

After the well layer is formed, with the film formation temperature maintained, $NH_3$ gas, $H_2$ gas, $N_2$ gas and TMG gas are supplied. As a result, a GaN layer as a barrier layer is formed.

Thereafter, the formation of an InGaN layer as a well layer and the formation of a GaN layer as a barrier layer are alternately performed. By forming about three to seven InGaN layers and about three to seven GaN layers, an active layer 4 having an MQW structure is obtained.

Then, with the film formation temperature maintained, $NH_3$ gas, $H_2$ gas, $N_2$ gas, TEG gas and TMIn gas are supplied into the film formation chamber. As a result, a sublimation preventing layer 5 having an In composition ratio of about 0.5% is formed on the active layer 4. The sublimation preventing layer 5 is formed to have a thickness of 3 nm.

Then, while gradually raising the film formation temperature from about 760° C. to 1,010° C., $NH_3$ gas, $H_2$ gas, $N_2$ gas, TEG gas and TMIn gas are supplied into the film formation chamber. As a result, an In composition gradient layer 6 in which the In composition ratio decreases from 0.5% to 0% in the thickness direction is formed. The In composition gradient layer 6 is formed to have a thickness of 9 nm.

Then, with the film formation temperature maintained at 1,010° C., NH₃ gas, H₂ gas, N₂ gas and TMG gas are supplied. At the same time, Cp₂Mg gas is supplied to perform doping of Mg which is a p-type dopant. As a result, a p-GaN layer 7 is formed. Thereafter, an n-side electrode 21 and a p-side electrode 71 are formed, whereby the semiconductor light emitting device A is completed.

The advantages of the semiconductor light emitting device A will be described below.

According to the present invention, the In composition gradient layer 6 and the p-GaN layer 7 are formed, with the active layer 4 covered with the sublimation preventing layer 5. Thus, the active layer 4 is not exposed to high temperature over 1,000° C., so that the sublimation of In from the active layer 4 is reliably prevented. As a result, the active layer 4 has a proper composition, so that the amount of light to be emitted from the semiconductor light emitting device A increases. The sublimation of In is effectively prevented particularly when the In composition ratio in the sublimation preventing layer 5 is 0.5% as is in Example 1. When the In composition ratio in the sublimation preventing layer 5 is 0 to 1%, both of the In sublimation from the active layer 4 and the increase of lattice strain are prevented. Further, when the thickness of the sublimation preventing layer 5 is not smaller than 3 nm, segregation due to the small thickness of the sublimation preventing layer 5 is prevented. Moreover, when the thickness of the sublimation preventing layer 5 is not larger than 20 nm, hole injection from the p-GaN layer 7 to the active layer 4 is prevented from becoming insufficient.

According to Example 1, the active layer 4 and the sublimation preventing layer 5 are bonded to the p-GaN layer 7 via the In composition gradient layer 6 so that the change in In composition ratio is continuous. As a result, considerable lattice strain between the active layer 4 and the p-GaN layer 7 is properly prevented. As a result, the laminated structure of the semiconductor light emitting device A is reliably prevented from breaking. In the present invention, however, the In composition ratio of the sublimation preventing layer 5 and that of the In composition gradient layer 6 may not be continuous at the boundary. Even in such a case, by providing the In composition gradient layer 6 with proper gradient of In composition ratio like that of Example 2, considerable lattice strain is prevented.

The superlattice layer 3 may be so designed that the electrical resistance in a direction perpendicular to the thickness direction is smaller than the electrical resistance in the thickness direction. This arrangement ensures that the current flows uniformly through the entire surface of the superlattice layer 3 and prevents the current from flowing locally through a particular portion. As a result, the amount of current, and hence, the amount of light emitted from the semiconductor light emitting device A increases.

In forming the In composition gradient layer 6 in manufacturing the semiconductor light emitting device A, a higher film formation temperature provides a lower In composition ratio. Thus, by monotonically increasing the film formation temperature with time as noted before, an In composition gradient layer 6 whose In composition ratio monotonically decreases in the thickness direction is obtained. Since the film formation temperature and the In composition ratio closely correspond to each other, the In composition ratio in the In composition gradient layer 6 is accurately controlled, which is advantageous for alleviating the lattice strain between the active layer 4 and the p-GaN layer 7.

The semiconductor light emitting device and its manufacturing method are not limited to the foregoing embodiments. The specific structure of each part of the semiconductor light emitting device and the manufacturing method may be varied in many ways.

For instance, the gradient of the In composition ratio in the In composition gradient layer 6 does not necessarily be linear but may be like a quadratic curve or a curve of a higher order, for example. Instead of the active layer made up of InGaN layers and GaN layers, an active layer made up of two kinds of InGaN layers which differ from each other in In composition ratio may be employed. The active layer of the present invention is not limited to one having an MQW structure. The semiconductor light emitting device A of the present invention may be designed to emit light of various wavelengths. For instance, in addition to blue light and green light, the semiconductor light emitting device may be designed to emit white light.

The invention claimed is:

1. A semiconductor light emitting device comprising:
a substrate;
a first nitride semiconductor layer supported by the substrate;
a second nitride semiconductor layer that is located farther from the substrate than the first nitride semiconductor layer is;
an active layer formed between the first and the second nitride semiconductor layers and containing InGaN;
a sublimation preventing layer formed between the active layer and the second nitride semiconductor layer and containing InGaN; and
an In composition gradient layer sandwiched between the sublimation preventing layer and the second nitride semiconductor layer, the In composition gradient layer having such an In composition ratio gradient that the In composition ratio decreases in a thickness direction toward the second nitride semiconductor layer;
wherein the sublimation preventing layer has an In composition ratio that is constant in a thickness direction of the sublimation preventing layer,
wherein a film formation temperature of the sublimation preventing layer is equal to a film formation temperature of the active layer, and the In composition ratio in the sublimation preventing layer is smaller than an In composition ratio in the active layer.

2. The semiconductor light emitting device according to claim 1, wherein the In composition ratio in the sublimation preventing layer is 0 to 1%.

3. The semiconductor light emitting device according to claim 1, wherein the sublimation preventing layer has a thickness of 3 to 20 nm.

4. The semiconductor light emitting device according to claim 1, wherein the In composition ratio gradient of the In composition gradient layer is so set that the In composition ratio decreases from 5% to 0% in the thickness direction from the sublimation preventing layer side toward the second nitride semiconductor layer side.

5. A method for manufacturing the semiconductor light emitting device as set forth in claim 1, the method comprising the step of forming the In composition gradient layer while monotonically increasing film formation temperature with time, the In composition gradient layer formation step being performed after the sublimation preventing layer is formed and before the second nitride semiconductor layer is formed.

6. The semiconductor light emitting device according to claim 1, further comprising a superlattice layer disposed between the first nitride semiconductor layer and the active layer.

7. The semiconductor light emitting device according to claim 6, wherein the superlattice layer is made up of InGaN layers and GaN layers alternating with the InGaN layers.

8. The semiconductor light emitting device according to claim 7, wherein each of the InGaN layers in the superlattice layer has an In composition ratio of 5 to 10%.

* * * * *